United States Patent
King et al.

(10) Patent No.: US 8,610,365 B2
(45) Date of Patent: Dec. 17, 2013

(54) SWITCHING POWER CONVERTER INPUT VOLTAGE APPROXIMATE ZERO CROSSING DETERMINATION

(75) Inventors: Eric J. King, Dripping Springs, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 26 days.

(21) Appl. No.: 13/290,032

(22) Filed: Nov. 4, 2011

(65) Prior Publication Data

US 2012/0286826 A1 Nov. 15, 2012

Related U.S. Application Data

(60) Provisional application No. 61/410,269, filed on Nov. 4, 2010.

(51) Int. Cl.
 *H05B 41/24* (2006.01)
(52) U.S. Cl.
 USPC ........... 315/246; 315/247; 315/268; 315/272; 315/273
(58) Field of Classification Search
 USPC .......................... 315/246, 247, 268, 272, 273
 See application file for complete search history.

(56) References Cited

U.S. PATENT DOCUMENTS

| | | | |
|---|---|---|---|
| 5,319,301 A | 6/1994 | Callahan et al. | |
| 5,430,635 A | 7/1995 | Liu | |
| 6,713,974 B2 | 3/2004 | Patcharnik et al. | |
| 6,858,995 B2 | 2/2005 | Lee et al. | |
| 6,900,599 B2 | 5/2005 | Ribarich | |
| 7,102,902 B1 | 9/2006 | Brown et al. | |
| 7,180,250 B1 | 2/2007 | Gannon | |
| 7,656,103 B2 | 2/2010 | Shteynberg et al. | |

(Continued)

FOREIGN PATENT DOCUMENTS

| EP | 1164819 | 12/2001 |
|---|---|---|
| EP | 2232949 | 9/2010 |

(Continued)

OTHER PUBLICATIONS

Azoteq, IQS17 Family, IQ Switch—ProxSense Series, Touch Sensor, Load Control and User Interface, IQS17 Datasheet V2.00.doc, Jan. 2007, pp. 1-51, Azoteq (Pty) Ltd., Paarl, Western Cape, Republic of South Africa.

(Continued)

*Primary Examiner* — Kenneth B. Wells
(74) *Attorney, Agent, or Firm* — Terrile, Cannatti, Chambers & Holland, LLP; Kent B. Chambers (57) ABSTRACT

In at least one embodiment, the controller senses a leading edge, phase cut AC input voltage value to a switching power converter during a cycle of the AC input voltage. The controller senses the voltage value at a time prior to a zero crossing of the AC input voltage and utilizes the voltage value to determine the approximate zero crossing. In at least one embodiment, by determining an approximate zero crossing of the AC input voltage, the controller is unaffected by any disturbances of the dimmer that could otherwise make detecting the zero crossing problematic. In at least one embodiment, the controller approximates the AC input voltage using a function that estimates a waveform of the AC input voltage and determines the approximate zero crossing of the AC input voltage from the approximation of the AC input voltage.

39 Claims, 9 Drawing Sheets

(56) References Cited

U.S. PATENT DOCUMENTS

| | | | |
|---|---|---|---|
| 7,719,246 | B2 | 5/2010 | Melanson |
| 7,733,678 | B1 | 6/2010 | Notohamiprodjo et al. |
| 7,759,881 | B1 | 7/2010 | Melanson |
| 7,872,427 | B2 | 1/2011 | Scianna |
| 8,102,167 | B2 * | 1/2012 | Irissou et al. ............ 323/300 |
| 8,115,419 | B2 * | 2/2012 | Given et al. ............ 315/307 |
| 8,169,154 | B2 | 5/2012 | Thompson et al. |
| 8,212,491 | B2 | 7/2012 | Kost |
| 8,212,492 | B2 * | 7/2012 | Lam et al. ............ 315/247 |
| 8,222,832 | B2 | 7/2012 | Zheng et al. |
| 2004/0105283 | A1 | 6/2004 | Schie et al. |
| 2004/0212321 | A1 | 10/2004 | Lys |
| 2006/0022648 | A1 | 2/2006 | Ben-Yaakov et al. |
| 2007/0182338 | A1 | 8/2007 | Shteynberg |
| 2007/0182347 | A1 | 8/2007 | Shteynberg |
| 2008/0205103 | A1 | 8/2008 | Sutardja et al. |
| 2008/0224629 | A1 | 9/2008 | Melanson |
| 2008/0224633 | A1 | 9/2008 | Melanson |
| 2008/0224636 | A1 | 9/2008 | Melanson |
| 2009/0195186 | A1 | 8/2009 | Guest et al. |
| 2009/0284182 | A1 | 11/2009 | Cencur |
| 2010/0002480 | A1 | 1/2010 | Huynh et al. |
| 2010/0013405 | A1 | 1/2010 | Thompson |
| 2010/0013409 | A1 | 1/2010 | Quek et al. |
| 2010/0164406 | A1 | 7/2010 | Kost et al. |
| 2010/0213859 | A1 | 8/2010 | Shteynberg et al. |
| 2010/0244726 | A1 | 9/2010 | Melanson |
| 2011/0043133 | A1 | 2/2011 | Van Laanen et al. |
| 2011/0121754 | A1 | 5/2011 | Shteynberg |
| 2011/0266968 | A1 | 11/2011 | Bordin et al. |

FOREIGN PATENT DOCUMENTS

| | | | |
|---|---|---|---|
| EP | 2257124 | A1 | 12/2010 |
| JP | 2008053181 | A | 3/2008 |
| WO | 02096162 | A1 | 11/2002 |
| WO | 2006079937 | | 8/2006 |
| WO | 2008029108 | | 3/2008 |
| WO | 2010011971 | A1 | 1/2010 |
| WO | WO2010035155 | A2 | 4/2010 |
| WO | 2011008635 | A1 | 1/2011 |

OTHER PUBLICATIONS

Chan, Samuel, et al, Design and Implementation of Dimmable Electronic Ballast Based on Integrated Inductor, IEEE Transactions on Power Electronics, vol. 22, No. 1, Jan. 2007, pp. 291-300, Dept. of Electron. Eng., City Univ. of Hong Kong.

Rand, Dustin, et al, Issues, Models and Solutions for Triac Modulated Phase Dimming of LED Lamps, Power Electronics Specialists Conference, 2007. PESC 2007. IEEE, Jun. 17-21, 2007, pp. 1398-1404, Boston, MA, USA.

Gonthier, Laurent, et al, EN55015 Compliant 500W Dimmer with Low-Losses Symmetrical Switches, ST Microelectronics, Power Electronics and Applications, 2005 European Conference, pp. 1-9, Aug. 7, 2006, Dresden.

Green, Peter, A Ballast That Can Be Dimmed from a Domestic (Phase Cut) Dimmer, International Rectifier, IRPLCFL3 rev.b, pp. 1-12, Aug. 15, 2003, El Segundo, California, USA.

Hausman, Don, Real-Time Illumination Stability Systems for Trailing-Edge (Reverse Phase Control) Dimmers, Lutron RTISS, Lutron Electronics Co, Dec. 2004, pp. 1-4, Coopersburg, PA, USA.

Lee, Stephen, et al, A Novel Electrode Power Profiler for Dimmable Ballasts Using DC Link Voltage and Switching Frequency Controls, IEEE Transactions on Power Electronics, vol. 19, No. 3, May 2004, pp. 847-833, City University of Hong Kong.

Engdahl, Tomi, Light Dimmer Circuits, 1997-2000, www.epanorama.net.

O'Rourke, Conan, et al, Dimming Electronic Ballasts, National Lighting Product Information Program, Specifier Reports, vol. 7, No. 3, Oct. 1999, pp. 1-24, Troy, NY, USA.

Supertex Inc, 56W Off-line LED Driver, 120VAC with PFC, 160V, 350mA Load, Dimmer Switch Compatible, DN-H05, pp. 1-20, Jun. 17, 2008, Sunnyvale, California, USA.

Wu, Tsai-Fu, et al, Single-Stage Electronic Ballast with Dimming Feature and Unity Power Factor, IEEE Transactions on Power Electronics, vol. 13, No. 3, May 1998, pp. 586-597.

International Search Report and Written Opinion dated May 11, 2012 issued in corresponding PCT Application No. PCT/US2011/059462.

International Preliminary Report on Patentability dated May 16, 2013 issued in corresponding PCT Application No. PCT/US2011/059462.

* cited by examiner

```
//Synthesized line section
reg[23:0] v_line_synth; // The resulting synthesized line voltage (the actual voltage if we are
connected)
reg[15:0] prior_peak_voltage; // The peak voltage of the line. Used to vary gain of parabolic.
Correction term for voltage dependance.
wire[7:0] v_pk_meas = prior_peak_voltage[7:0]; // Used for corrections due to actual line voltage wire[7:0] synth_out=v_line_synth[23:16]; // Only taking the top 8 bits // Using the equation I=C*dv/dt. Assume C = 1. Also dt is a constant.
// To synth Voltage on line, we create an internal parabolic current (I=(1-Vx/
256)*K)
wire [23:0] current = (24'h000100 -({16'b0,synth_out} + {16'b0, 3'b0,
synth_out[7:3]}) ) and Vx is the rectified input voltage V@R_IN;  // para I=(1-v/
192)

// run difference equation. K(gain of parabolic) is determined by the peak voltage.
wire signed[23:0] delta_v = {8'b0,prior_peak_voltage} -{24'd170} + {{16{v_peak_offset[7]}},
v_peak_offset} + (mode_120 ? 24'b0 : 24'hffffe0) ;

wire[23:0] gain = 24'h00100 + (delta_v<<1); // This is the K term above. The actual line voltage (in
rms sense not present sense) is used to alter the gain term K.
wire[23:0] current_gain = gain * current;
```

(CONTINUED FROM FIGURE 7A)

```
// calculate the next voltage. V_new = V_old -dv. Since C is 1, this is simple calculation. The
dt term is absorbed in the current_gain calculation.
// dv = I/C*dt = I/1*dt = current_gain
wire[24:0] new_vline_calc = {1'b0,v_line_synth} -{1'b0,(current_gain>>>8)}; // synth of new
voltage from I=C*dv/dt // update the voltage on the clock edge
always @(posedge mclk or negedge rsb)
    if(~rsb)
        v_line_synth<=0;
    else
        if(~synth_line || trail_mode)
            v_line_synth<=v_line<<16;
        else if(~new_vline_calc[24]) // no overflow
            v_line_synth<=new_vline_calc[23:0];
        else
            v_line_synth<=24'd0;
```

SWITCHING POWER CONVERTER INPUT VOLTAGE APPROXIMATE ZERO CROSSING DETERMINATION

CROSS-REFERENCE TO RELATED APPLICATION

This application claims the benefit under 35 U.S.C. §119(e) and 37 C.F.R. §1.78 of U.S. Provisional Application No. 61/410,269, filed on Nov. 4, 2010, and is incorporated by reference in its entirety.

BACKGROUND OF THE INVENTION

1. Field of the Invention

The present invention relates in general to the field of electronics, and more specifically to a method and system for utilizing a switching power converter and determining an approximate zero crossing of an input voltage to the switching power converter.

2. Description of the Related Art

Many electronic systems include circuits, such as switching power converters that interface with a dimmer. The interfacing circuits deliver power to a load in accordance with the dimming level set by the dimmer. For example, in a lighting system, dimmers provide an input signal to a lighting system. The input signal represents a dimming level that causes the lighting system to adjust power delivered to a lamp, and, thus, depending on the dimming level, increase or decrease the brightness of the lamp. Many different types of dimmers exist. In general, dimmers generate a digital or analog coded dimming signal that indicates a desired dimming level. For example, some analog based dimmers utilize a triode for alternating current ("triac") device to modulate a phase angle of each cycle of an alternating current ("AC") supply voltage. "Modulating the phase angle" of the supply voltage is also commonly referred to as "phase cutting" the supply voltage. Phase cutting the supply voltage reduces the average power supplied to a load, such as a lighting system, and thereby controls the energy provided to the load.

Once a triac-based dimmer begins conducting during a cycle of an alternating current ("AC") supply voltage, to prevent the triac from disadvantageously, prematurely disconnecting during mid-cycle of the supply voltage, the switching power converter draws a minimum current referred to as a "hold current". As long as an input current to the switching power converter is greater than or equal to the hold current, the triac-based dimmer should not prematurely disconnect. For a leading edge dimmer, a premature disconnect occurs when the dimmer begins conducting and stops conducting prior to reaching a zero crossing of the supply voltage. Premature disconnects can cause problems with the lighting system, such as flicker and instability.

Figure 1:
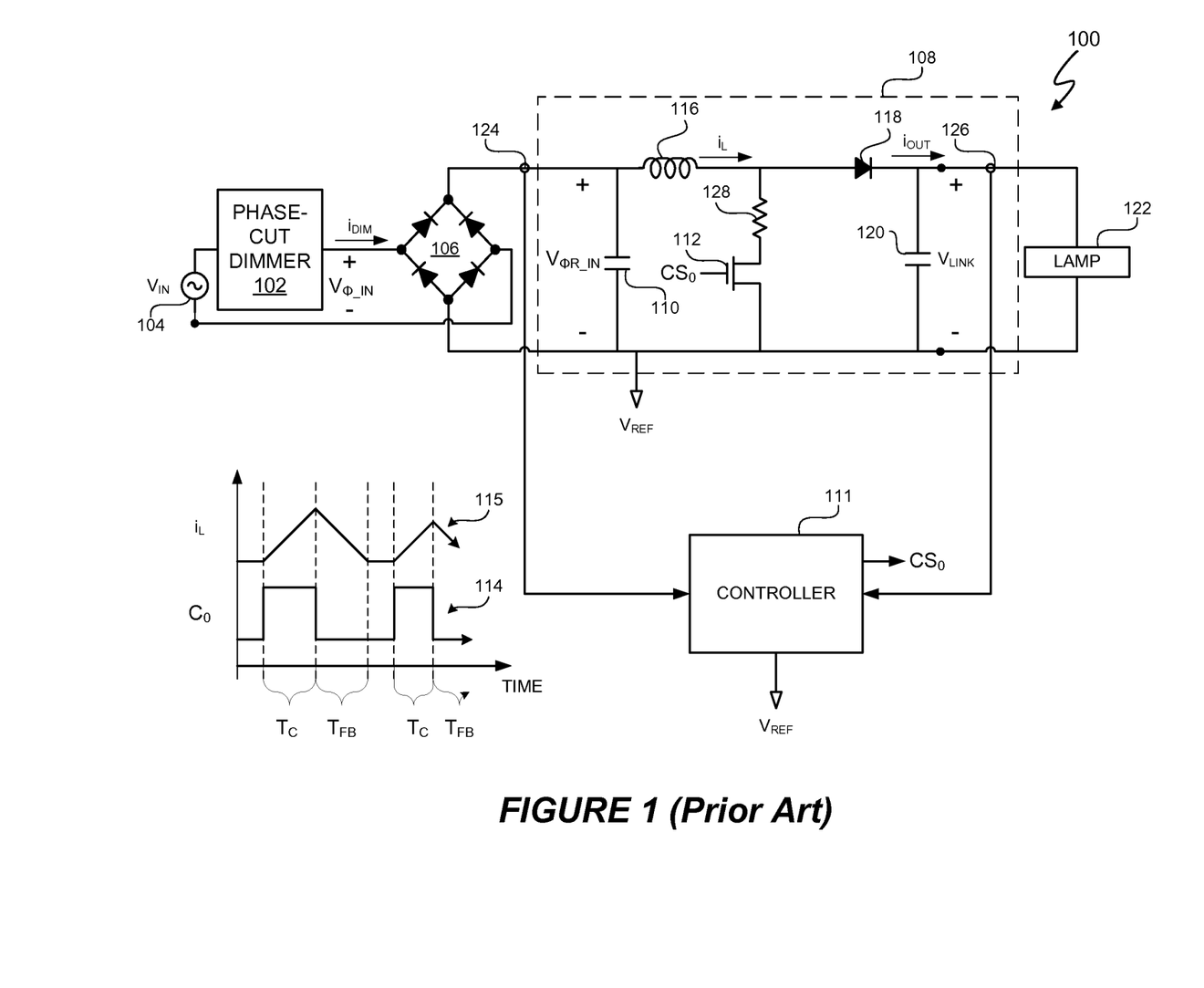
FIG. 1 (labeled prior art) depicts a lighting system that includes a triac-based dimmer.
Figure 2:
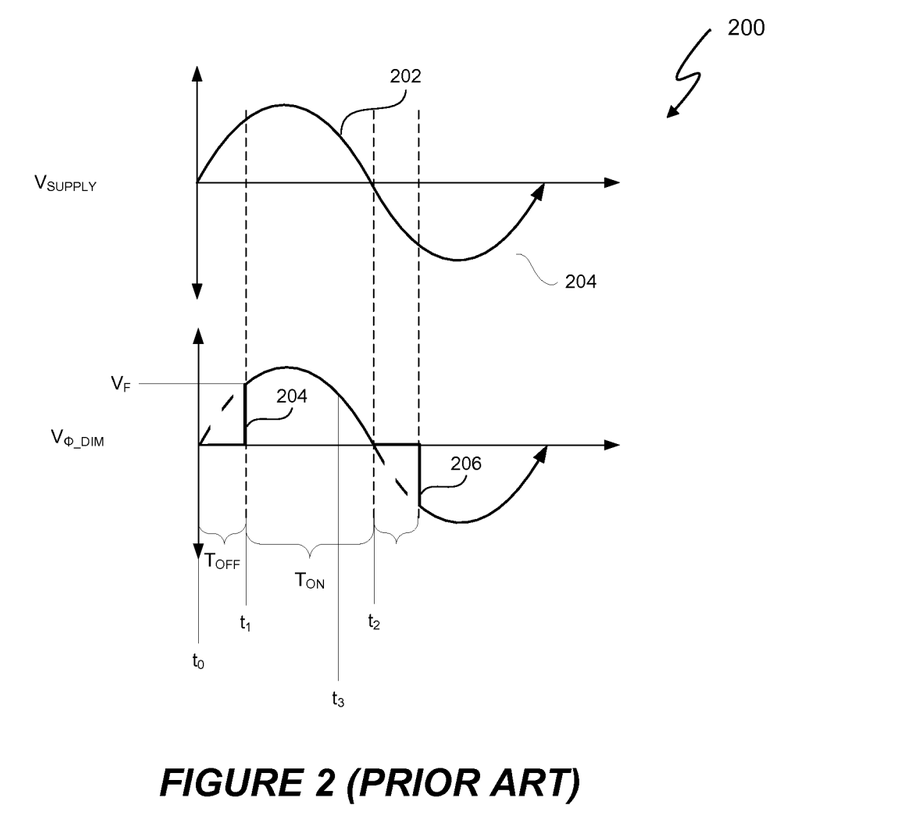
FIG. 2 (labeled prior art) depicts exemplary voltage graphs associated with the lighting system of FIG. 1.

FIG. 1 depicts a lighting system 100 that includes a leading edge, phase-cut dimmer 102. FIG. 2 depicts ideal, exemplary voltage graphs 200 associated with the lighting system 100. Referring to FIGS. 1 and 2, the lighting system 100 receives an AC supply voltage $V_{IN}$ from voltage supply 104. The supply voltage $V_{IN}$, indicated by voltage waveform 202, is, for example, a nominally 60 Hz/110 V line voltage in the United States of America or a nominally 50 Hz/220 V line voltage in Europe. A leading edge dimmer 102 phase cuts leading edges, such as leading edges 204 and 206, of each half cycle of supply voltage $V_{IN}$. Since each half cycle of supply voltage $V_{IN}$ is 180 degrees of the supply voltage $V_{IN}$, the leading edge dimmer 102 phase cuts the supply voltage $V_{IN}$ at an angle greater than 0 degrees and less than 180 degrees. Generally, the voltage phase cutting range of a leading edge dimmer 102 is 10 degrees to 170 degrees.

The input signal voltage $V_{\Phi\_IN}$ to the lighting system 100 represents a dimming level that causes the lighting system 100 to adjust power delivered to a lamp 122, and, thus, depending on the dimming level, increase or decrease the brightness of the lamp 122. The leading edge dimmer 102 can be any type of leading edge dimmer, such as a triac-based leading edge dimmer available from Lutron Electronics, Inc. of Coopersberg, Pa. ("Lutron"). A triac-based leading edge dimmer is described in the Background section of U.S. patent application Ser. No. 12/858,164, entitled *Dimmer Output Emulation*, filed on Aug. 17, 2010, and inventor John L. Melanson.

The phase cut dimmer 102 supplies the input voltage $V_{\Phi\_IN}$ as modified by the phase cut dimmer 102 to a full bridge diode rectifier 106. The full bridge rectifier 106 supplies an AC rectified voltage $V_{\Phi R\_IN}$ to the switching power converter 108. Thus, since the input voltage $V_{\Phi\_IN}$ is derived from the input supply voltage $V_{IN}$, the rectified input voltage $V_{\Phi R\_IN}$ is also derived from the input supply voltage $V_{IN}$. Capacitor 110 filters high frequency components from rectified voltage $V_{\Phi R\_IN}$. To control the operation of switching power converter 108, controller 111 generates a control signal $CS_0$ to control conductivity of field effect transistor (FET) switch 112. The control signal $CS_0$ is a pulse width modulated signal. Control signal $CS_0$ waveform 114 represents an exemplary control signal $CS_0$. Each pulse of control signal $CS_0$ turns switch 112 ON (i.e. conducts), and the inductor current $i_L$ increases, as shown in the exemplary inductor current waveform 115, to charge inductor 116 during a charging phase $T_C$. Diode 118 prevents current flow from link capacitor 120 into switch 112. When the pulse ends, the inductor 116 reverses voltage polarity (commonly referred to as "flyback"), and the inductor current $i_L$ decreases during the flyback phase $T_{FB}$, as shown in inductor current waveform 115. The inductor current $i_L$ boosts the link voltage across the link capacitor 120 through diode 118.

The switching power converter 108 is a boost-type converter, and, thus, the link voltage $V_{LINK}$ is greater than the rectified input voltage $V_{\Phi R\_IN}$. Controller 111 senses the rectified input voltage $V_{\Phi R\_IN}$ at node 124 and senses the link voltage $V_{LINK}$ at node 126. Controller 111 operates the switching power converter 108 to maintain an approximately constant link voltage $V_{LINK}$ for lamp 122, provide power factor correction, and correlate the output current $i_{OUT}$ with the phase cut angle of the rectified input voltage $V_{\Phi R\_IN}$. Lamp 132 includes one or more light emitting diodes.

It is desirable to improve interfacing with triac-based dimmers.

SUMMARY OF THE INVENTION

In one embodiment of the present invention, an apparatus includes a controller having an input to sense a leading edge, phase cut alternating current (AC) input voltage to a switching power converter at least at a first time during a cycle of the AC input voltage. The cycle of the AC input voltage is derived from a cycle of the AC input supply voltage, and the first time is prior to an approximate zero crossing of the cycle of the AC input supply voltage. At least some zero crossings of the AC input supply voltage are not directly observable by the controller. The controller is configured to determine the approximate zero crossing of the AC input supply voltage based on a voltage value of the phase cut AC input voltage sensed at the first time.

In another embodiment of the present invention, a method includes receiving a sense signal indicating a leading edge, phase cut alternating current (AC) input voltage to a switching power converter. The sense signal is received at least at a first time during a cycle of the AC input voltage, the cycle of the AC input voltage is derived from a cycle of the AC input supply voltage, and the first time is prior to an approximate zero crossing of the cycle of the AC input supply voltage. At least some zero crossings of the AC input supply voltage are not directly observable by a controller of a switching power converter. The method further includes determining the approximate zero crossing of the AC input supply voltage based on a voltage value of the phase cut AC input voltage sensed at the first time.

In another embodiment of the present invention, a method includes exposing a leading edge, phase cut alternating current (AC) input voltage supplied to a switching power converter for part of a cycle of the AC input voltage. The exposed AC input voltage is used to supply current to a load, and the AC input voltage is derived from an AC input supply voltage. The method further includes sensing the AC input voltage and ceasing exposure of the AC input voltage after sensing the AC input voltage. The method further includes determining an approximate zero crossing of the AC input supply voltage based on a value of the sensed AC input voltage.

In a further embodiment of the present invention, an apparatus includes means for receiving a sense signal indicating a leading edge, phase cut alternating current (AC) input voltage to a switching power converter. The sense signal is received at least at a first time during a cycle of the AC input voltage, the cycle of the AC input voltage is derived from a cycle of the AC input supply voltage, and the first time is prior to an approximate zero crossing of the cycle of the AC input supply voltage. At least some zero crossings of the AC input supply voltage are not directly observable by a controller of a switching power converter. The apparatus further includes means for determining the approximate zero crossing of the AC input supply voltage based on a voltage value of the phase cut AC input voltage sensed at the first time.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

In at least one embodiment, an electronic system includes a controller, and the controller determines an approximate zero crossing of an alternating current (AC) input supply voltage to a switching power converter based on a voltage value of the AC input voltage. The term "approximate" as used herein means exact or sufficiently exact. A zero crossing is sufficiently exact if the zero crossing can be used by the controller in lieu of the actual zero crossing. Actually 'detecting' a zero crossing of the AC input supply voltage, as opposed to 'determining' an approximate zero crossing of the AC input supply voltage, can be problematic in some circumstances. For example, triac-based dimmers have conventionally been used with incandescent lamps. Incandescent lamps are generally immune from disturbances in the phase cut voltage from the triac-based dimmer, such as premature disconnection and electronic noise generated by a triac-based dimmer. However, disturbances of a supply voltage by a dimmer, such as premature disconnection, premature conduction, and electronic noise, can be problematic to relatively low-power, actively controlled electronic systems, such as light emitting diode (LED) based lighting systems. In at least one embodiment, the controller utilizes the zero crossing of the AC input voltage to begin one or more operations, such as providing a sufficiently low input impedance for the dimmer at the zero crossing to hold a dimmer output voltage at approximately zero volts as described in, for example, U.S. patent application Ser. No. 12/858,164, filed Aug. 17, 2010, entitled: "Dimmer Output Emulation", and inventor: John L. Melanson (referred to herein as "Melanson I") and U.S. patent application Ser. No. 13/217,174, filed Aug. 24, 2011, entitled: "Multi-Mode Dimmer Interfacing Including Attach State Control", and inventors: Eric J. King and John L. Melanson, which are both incorporated by reference in their entireties.

In at least one embodiment, the controller senses a leading edge, phase cut AC input voltage value to a switching power converter during a cycle of the AC input voltage. The controller senses the voltage value at a time prior to a zero crossing of the AC input voltage. The controller utilizes the voltage value to determine an approximate zero crossing of the AC input supply voltage. In at least one embodiment, by determining an approximate zero crossing of the AC input voltage, the controller is unaffected by any disturbances of the dimmer that could otherwise make detecting the zero crossing from sensing the actual AC input voltage problematic. The particular way of determining an approximate zero crossing is a matter of design choice. In at least one embodiment, the controller approximates the AC input voltage using a function that estimates a waveform of the AC input voltage and determines the approximate zero crossing of the AC input voltage from the approximation of the AC input voltage. The particular function can be any type of function, such as a polynomial function or a trigonometric function. In at least one embodiment, the controller includes dedicated circuits to determine the approximate zero crossing. In at least one embodiment, the controller includes a processor and a memory, and the memory includes code that is executable by the processor to determine the approximate zero crossing. In at least one embodiment, the controller includes a look-up table that identifies when the zero crossing will occur based on the sensed voltage value.

Determining when to sense the voltage value during a cycle of the AC input voltage is a matter of design choice. In at least one embodiment, the controller senses the voltage value during a portion of the AC input voltage when the dimmer has a high probability of providing a relatively undisturbed input voltage to the switching power converter. Sensing the voltage value during a relatively undisturbed portion of the AC input voltage allows the controller to utilize a voltage value that accurately represents a voltage value of a supply voltage to the dimmer. Additionally, in at least one embodiment, the controller senses the voltage value when the phase cut voltage is relatively undisturbed and when the switching power converter has received sufficient power to meet power demands by a load. In at least one embodiment, after the controller senses the voltage value, the controller causes the electronic system to dissipate excess energy as, for example, (i) described in U.S. patent application Ser. No. 13/289,845, filed Nov. 4, 2011, entitled "Controlled Power Dissipation in a Switch Path in a Lighting System", and inventors John L. Melanson and Eric J. King, (ii) U.S. patent application Ser. No. 13/289,931, filed Nov. 4, 2011, entitled "Controlled Power Dissipation in a Lighting System", and inventors John L. Melanson and Eric J. King, (iii) Ser. No. 13/289,967 filed Nov. 4, 2011, entitled "Controlled Power Dissipation in a Link Path in a Lighting System", and inventors John L. Melanson and Eric J. King, and/or (iv) dissipate power through another power dissipation circuit. The U.S. Patent Applications identified in (i), (ii), and (iii) are collectively referred to as the "Power Dissipation Applications".

Figure 3:
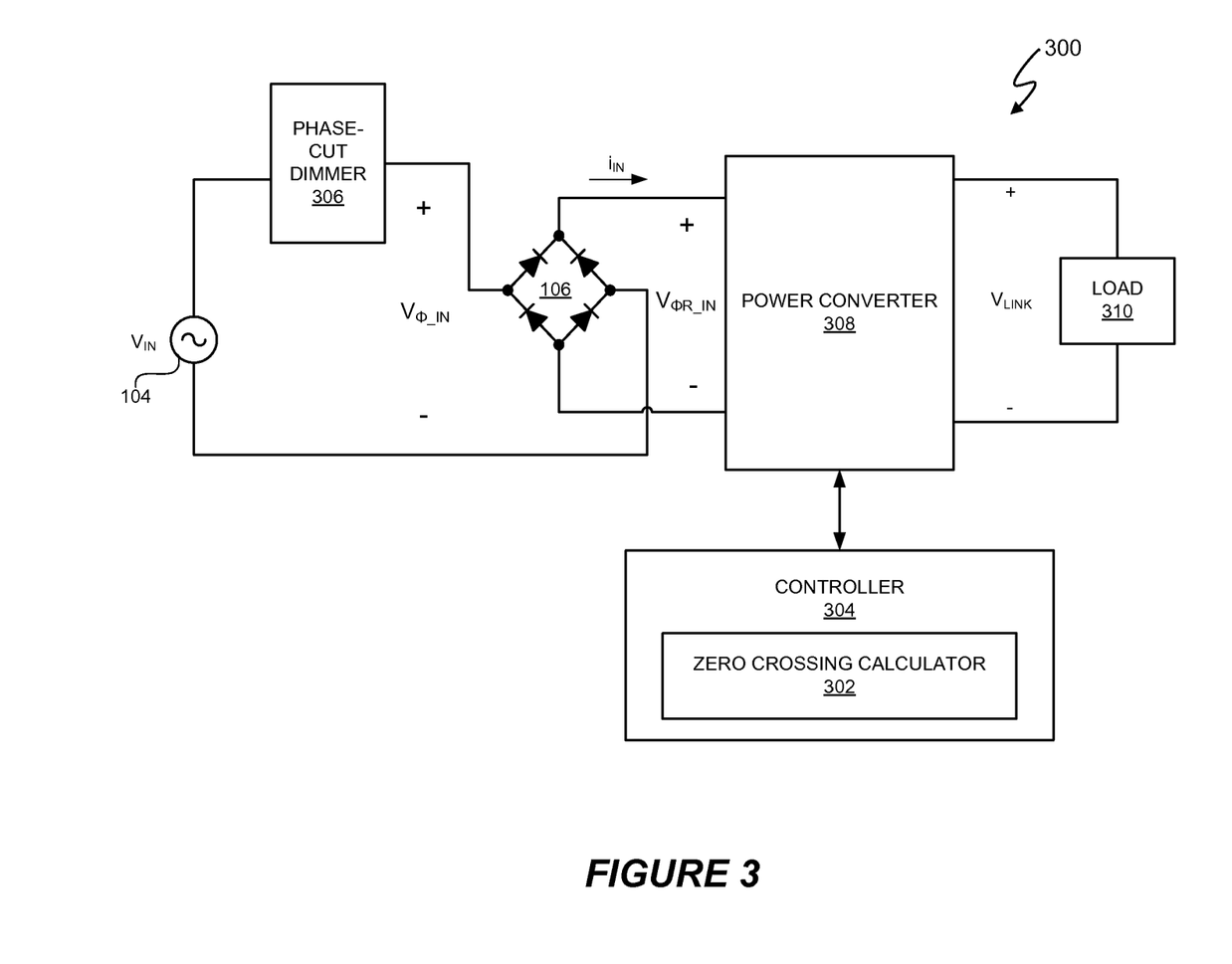
FIG. 3 depicts an electronic system that includes a controller having a zero crossing calculator.
Figure 4:
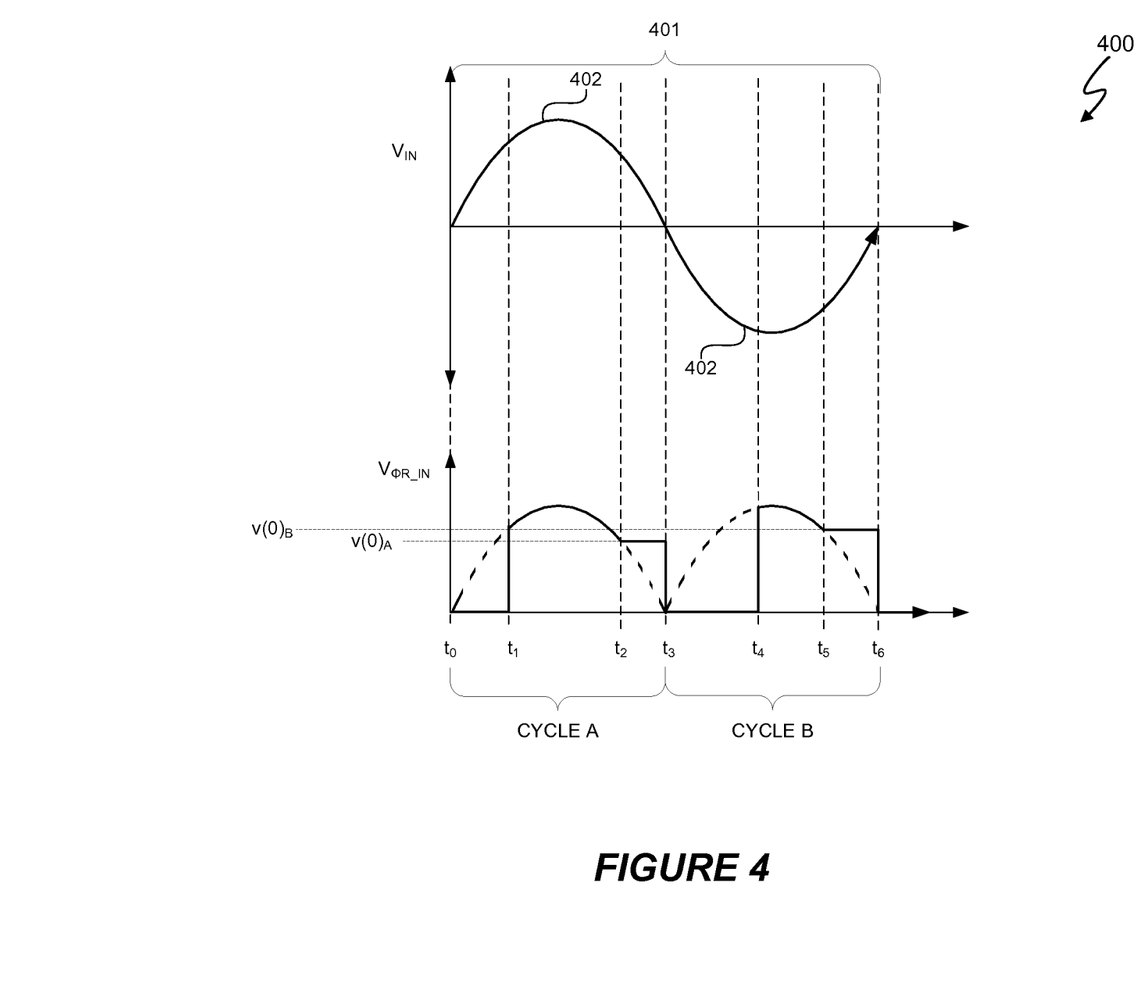
FIG. 4 depicts exemplary input supply voltage and a rectified input voltage for the system of FIG. 3.

FIG. 3 depicts an electronic system 300 that includes a zero crossing calculator 302 of controller 304 that determines the approximate zero crossing of the rectified input voltage $V_{\Phi R\_IN}$. FIG. 4 depicts exemplary voltage waveforms 400 of the input supply voltage $V_{IN}$ and rectified input voltage $V_{\Phi R\_IN}$. Referring to FIGS. 3 and 4, dimmer 306 is a leading edge, phase cut dimmer. Dimmer 306 can be any type of leading edge, phase cut dimmer including a triac-based dimmer or a field effect transistor (FET) based dimmer. One cycle of the input supply voltage $V_{IN}$ is depicted in FIG. 4. The rectified input voltage $V_{\Phi R\_IN}$ depicts two cycles, cycle A and cycle B, which are derived from the cycle 401 of the input supply voltage $V_{IN}$. Cycle A is a phase cut version of the first half cycle 402 of the input supply voltage $V_{IN}$, and cycle B is a rectified, phase cut version of the second half cycle 404 of the input supply voltage $V_{IN}$. Cycle A occurs from time $t_0$ until the zero crossing of the input supply voltage $V_{IN}$ at time $t_3$. Cycle B occurs from time $t_3$ until the next zero crossing at time $t_6$ of the input supply voltage $V_{IN}$. In at least one embodiment, the dimmer 306 phase cuts the input supply voltage $V_{IN}$ from voltage supply 104 to generate the phase cut input voltage $V_{\Phi\_IN}$. The full-bridge diode rectifier rectifies the phase cut input voltage $V_{\Phi\_IN}$ to generate the rectified input voltage $V_{\Phi R\_IN}$. Between times $t_0$ and $t_1$, the dimmer 306 does not conduct current from the voltage supply 104 and, thus, phase cuts the supply voltage $V_{IN}$ until time $t_1$. At time $t_1$, the dimmer 306 conducts so that the rectified input voltage $V_{\Phi R\_N}$ equals the input voltage $V_{IN}$. At time $t_2$, the controller 304 senses the voltage value $v(0)_A$ of rectified input voltage $V_{\Phi R\_IN}$ during cycle A of the rectified input voltage $V_{\Phi R\_IN}$. The place and manner of sensing a voltage value of the rectified input voltage $V_{\Phi R\_IN}$ that represents a voltage value of the input supply voltage $V_{IN}$ is a matter of design choice. In at least one embodiment, the controller 304 senses the voltage value $v(0)_A$ downstream (right side) of the rectifier 106 from the phase-cut input voltage $V_{\Phi\_IN}$. In at least one embodiment, the controller 304 senses the voltage value $v(0)_A$ upstream (left side) of the rectifier 106 from the phase-cut input voltage $V_{\Phi\_IN}$.

The controller 304 includes a zero crossing calculator 302 to determine an approximate zero crossing of the rectified input voltage $V_{\Phi R\_IN}$. For cycle A of the rectified input voltage $V_{\Phi R\_IN}$, the zero crossing occurs at time $t_3$. The particular implementation of the zero crossing calculator 302 is a matter of design choice. Various exemplary embodiments of the zero crossing calculator 302 are subsequently described in more detail. In at least one embodiment, the time $t_2$ is selected as the time to sense the voltage value $v(0)_A$ because the power converter 308 has received sufficient power from voltage supply 104 to maintain an approximately constant link voltage $V_{LINK}$ and meet power demands of load 310. In at least one embodiment, at time $t_2$ the controller 304 maintains the rectified input voltage $V_{\Phi R\_N}$ at the voltage value $v(0)_A$ until reaching the zero crossing at time $t_3$. Maintaining the voltage of the rectified input voltage $V_{\Phi R\_IN}$ effectively stops the current flow $i_{IN}$ into the power converter 308. At the zero crossing, in at least one embodiment, the controller 304 causes the rectified input voltage $V_{\Phi R\_IN}$ to rapidly decrease to approximately 0 volts. How to dissipate the energy associated with decreasing the rectified input voltage $V_{\Phi R\_IN}$ to approximately 0 volts is also a matter of design choice. In at least one embodiment, the power is dissipated as, for example, described in any or all of the Power Dissipation Applications and/or through another power dissipation circuit.

Controller 304 continues to determine the approximate zero crossing of the rectified input voltage $V_{\Phi R\_IN}$ in subsequent cycles of the rectified input voltage $V_{\Phi R\_IN}$ as, for example, shown in cycle B. In cycle B of the rectified input voltage $V_{\Phi R\_IN}$, the phase cut dimmer 306 phase cuts the rectified input voltage $V_{\Phi R\_IN}$ from time $t_3$ until time $t_4$. At time $t_5$, the controller 304 senses the voltage value $v(0)_B$ of the rectified input voltage $V_{\Phi R\_IN}$ at time $t_5$. The zero crossing calculator 302 then determines the approximate zero crossing time that occurs at time $t_6$ as previously described. In at least one embodiment, the actual zero crossings of the rectified input voltage $V_{\Phi R\_IN}$ are not directly observable by the controller 304, and, thus, are not actually detectable by the controller 304. In at least one embodiment, for a 120 Hz rectified input voltage $V_{\Phi R\_IN}$, the sensing times of the rectified input voltage $V_{\Phi R\_IN}$, such as times $t_2$ and $t_5$, are within a range 0.5-5 ms of the approximate zero crossing time, such as respective times $t_3$ and $t_6$. The sensing times of the rectified input voltage $V_{\Phi R\_IN}$, such as times $t_2$ and $t_5$, are within a range of 0.25-5 ms of the approximate zero crossing time, such as respective times $t_3$ and $t_6$. In at least one embodiment, the range sensing times are inversely linearly related with respect to the frequency of the rectified input voltage $V_{\Phi R\_IN}$, e.g. for a 240 Hz rectified input voltage $V_{\Phi R\_IN}$, the sensing times are reduced by 50%. In at least one embodiment, the sensed voltage, such as sensed voltage $v(0)_A$ and $v(0)_B$, are greater than or equal to 50V or, in at least one embodiment, greater than 0.3 times an RMS peak value of the rectified input voltage $V_{\Phi R\_IN}$.

The controller 304 controls the power converter 308. The particular type of power converter 308 is a matter of design choice. For example, the power converter 308 can be a boost-type switching power converter such as switching power converter 108, a buck type switching power converter, a boost-buck type switching power converter, or a Cúk type switching power converter. In at least one embodiment, controller 304 controls the power converter 308 as described in, for example, U.S. patent application Ser. No. 11/967,269, entitled "Power Control System Using a Nonlinear Delta-Sigma Modulator With Nonlinear Power Conversion Process Modeling", filed on Dec. 31, 2007, inventor John L. Melanson (referred to herein as "Melanson II"), now U.S. Pat. No. 7,719,246, U.S. patent application Ser. No. 11/967,275, entitled "Programmable Power Control System", filed on Dec. 31, 2007, and inventor John L. Melanson (referred to herein as "Melanson III"), now U.S. Pat. No. 7,969,125, U.S. patent application Ser. No. 12/495,457, entitled "Cascode Configured Switching Using at Least One Low Breakdown Voltage Internal, Integrated Circuit Switch to Control At Least One High Breakdown Voltage External Switch", filed on Jun. 30, 2009 ("referred to herein as "Melanson IV"), and inventor John L. Melanson, now U.S. Pat. No. 8,248,145, and U.S. patent application Ser. No. 13/174,404, entitled "Constant Current Controller With Selectable Gain", filing date Jun. 30, 2011, and inventors John L. Melanson, Rahul Singh, and Siddharth Maru (referred to herein as "Melanson V"), which are all incorporated by reference in their entireties.

Figure 5:
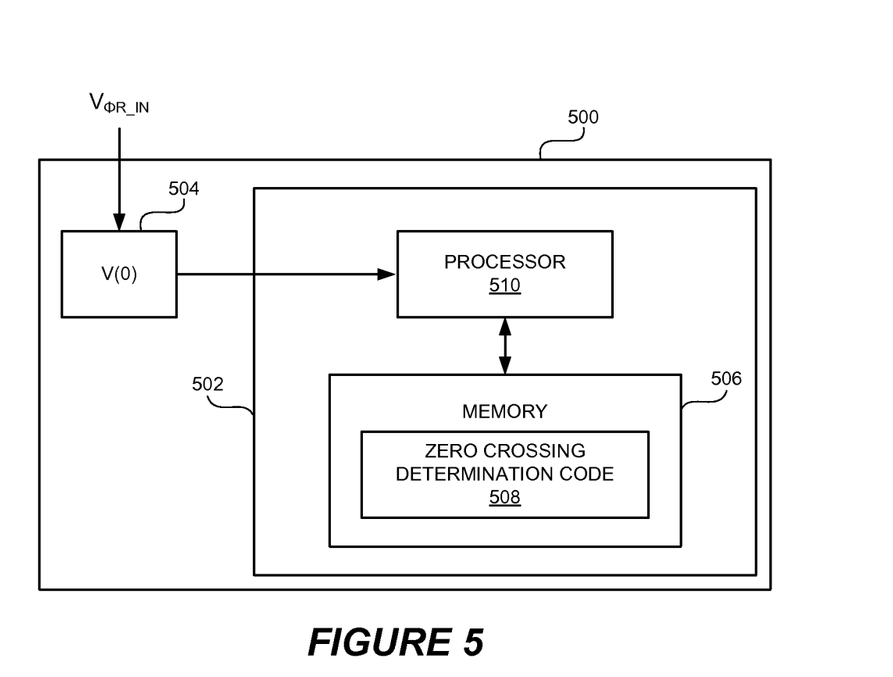
FIG. 5 depicts a controller that represents an embodiment of the controller of FIG. 3.
Figure 6:
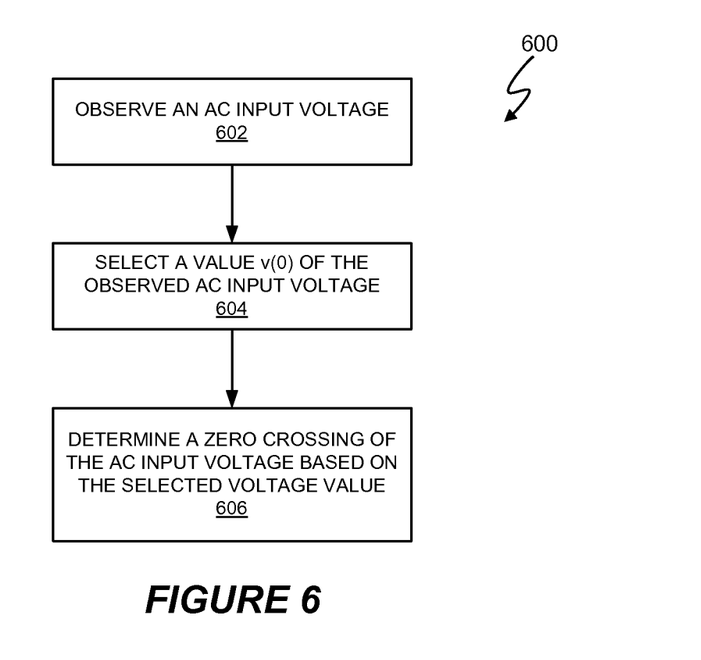
FIG. 6 depicts an exemplary approximate zero crossing determination process.

FIG. 5 depicts a controller 500, which represents one embodiment of controller 304. Controller 500 includes zero crossing calculator 502, which represents one embodiment of the zero crossing calculator 302. FIG. 6 depicts an approximate zero crossing determination process 600, which represents one embodiment of an approximate zero crossing determination process utilized by the controller 500 to determine an approximate zero crossing of the rectified input voltage $V_{\Phi R\_IN}$.

Referring to FIGS. 5 and 6, in operation 602, the controller 500 observes the rectified input voltage $V_{\Phi R\_IN}$. In operation 604, the controller selects a value v(0) of the rectified input voltage $V_{\Phi R\_IN}$ and stores the selected value v(0) in a register 504. The zero crossing calculator 500 includes a memory 506 that stores approximate zero crossing determination code 508. The processor 510 communicates with the memory 506 and, in operation 606, executes the approximate zero crossing determination code 508 to synthesize the rectified input voltage $V_{\Phi R\_IN}$ and determine an approximate zero crossing of the synthesized rectified input voltage $V_{\Phi R\_IN}$. The processor 510 utilizes the sensed voltage value V(0) as an initial value to determine an approximate zero crossing of the rectified input voltage $V_{\Phi R\_IN}$. The particular implementation of the approximate zero crossing determination code 508 is a matter of design choice. In at least one embodiment, the approximate zero crossing determination code 508 implements a parabolic function as, for example, subsequently described. In other embodiments, the approximate zero crossing determination code 508 implements other polynomial functions or trigonometric functions, such as an actual sine function, to synthesize the rectified input voltage $V_{\Phi R\_IN}$ to determine zero crossings of the rectified input voltage $V_{\Phi R\_IN}$. In at least one embodiment, the approximate zero crossing determination code 508 includes code to access a look up table, and the look up table includes zero crossing times corresponding to possible values of the sensed voltage value V(0).

Figure 7A:
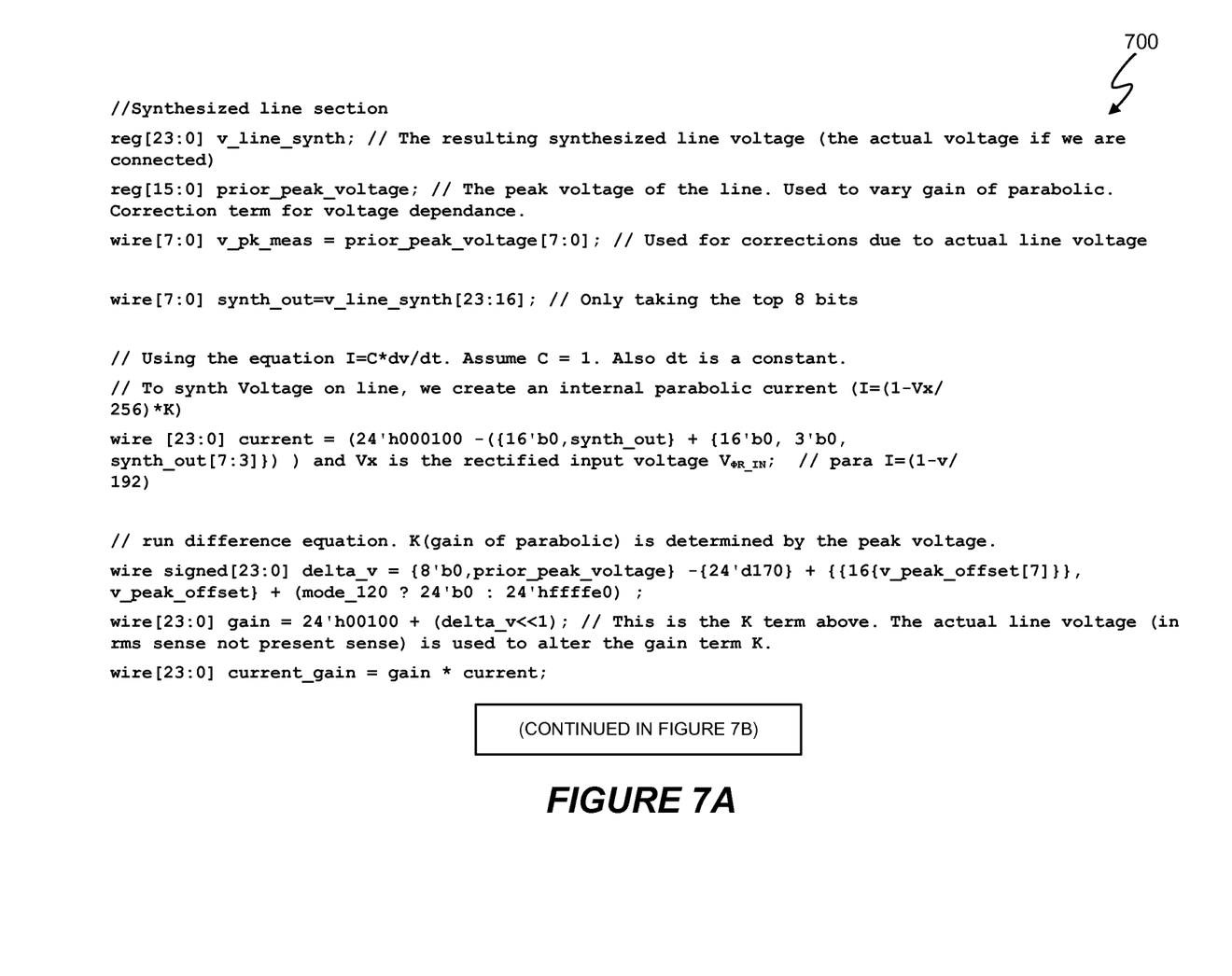
FIG. 7 depicts exemplary approximate zero crossing determination code.
Figure 7B:
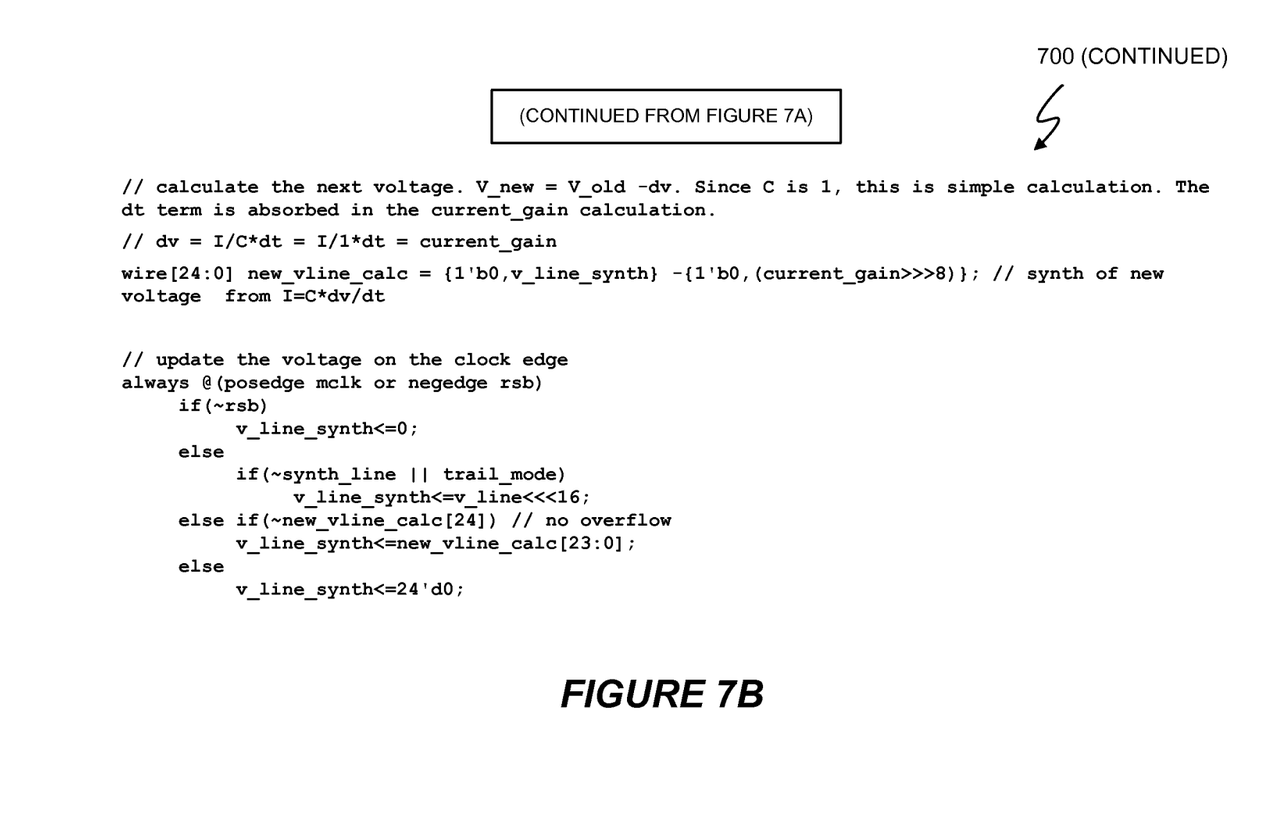
Figure 8:
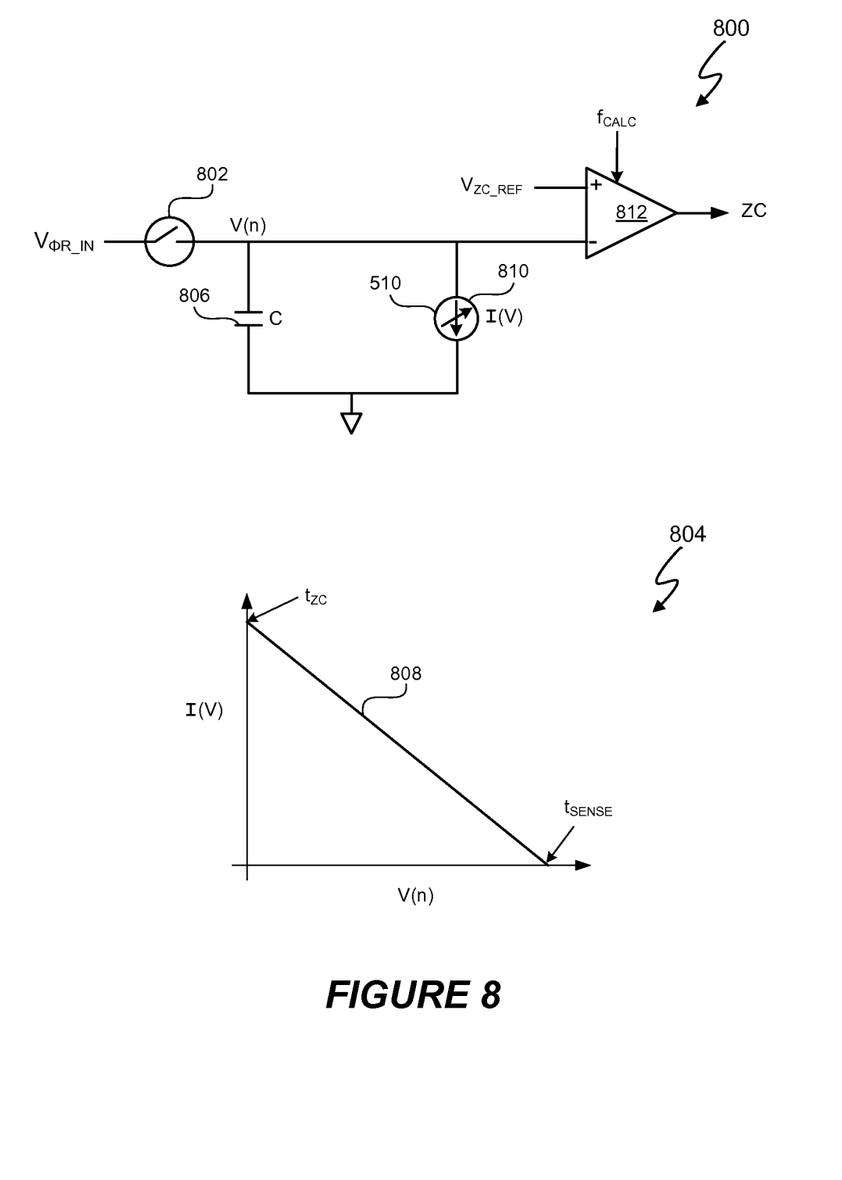
FIG. 8 depicts an exemplary capacitor/current model utilized by the approximate zero crossing determination code of FIG. 7.

FIGS. 7A and 7B collectively depict zero crossing code 700, which represents one embodiment of the zero crossing code 508. The zero crossing code 700 begins in FIG. 7A and continues in FIG. 7B. The zero crossing code 700 implements an iterative approximate zero crossing determination process using a parabolic function based on modeling changes in voltage across a capacitor resulting from current flow from the capacitor. FIG. 8 depicts an exemplary capacitor/current model 800 utilized by the zero crossing code 700. The capacitor/current model 800 models the input supply voltage $V_{IN}$ using a parabolic function to synthesize the input supply voltage $V_{IN}$.

Referring to FIGS. 7 and 8, the zero crossing code 700 utilizes an initial sample V(0) of the rectified input voltage $V_{\Phi R\_IN}$. The capacitor/current model 800 models the sampling with a switch 802 that momentarily closes at a time $t_{SENSE}$ and then immediately opens. The time $t_{SENSE}$ at which the rectified input voltage $V_{\Phi R\_IN}$ is sensed is a matter of design choice and, in at least one embodiment, is selected on a cycle-by-cycle basis of the rectified input voltage $V_{\Phi R\_IN}$. In at least one embodiment, the sensing time $t_0$ occurs when the voltage supply 104 (FIG. 3) has supplied sufficient power to meet the power demand of load 310 (FIG. 3). Thus, in at least one embodiment, the time $t_{SENSE}$ corresponds to time $t_2$ for cycle A and time $t_5$ for cycle B of the rectified input voltage $V_{\Phi R\_IN}$ as depicted in FIG. 4. In at least one embodiment, for a 120 Hz rectified input voltage $V_{\Phi R\_IN}$, the time $t_{SENSE}$ is within 0.5-5 ms of the zero crossing time $t_{ZC}$. In at least one embodiment, for a 120 Hz rectified input voltage $V_{\Phi R\_IN}$, the time $t_{SENSE}$ is within 0.25-5 ms of the zero crossing time $t_{ZC}$.

The voltage-current graph 804 models a current I(V(n)) as a function of the voltage V(n) across the capacitor 806, i.e. I(V(n))=f(V(n)). The voltage-current graph 804 presents a linear relationship between the voltage V(n) across the capacitor 806 and the current I(V(n)) as, for example, represented by Equation [1]:

$$I(V(n))=m \cdot V(n)+b \qquad [1]$$

"V(n)" represents the voltage across capacitor 806, which represents the input supply voltage $V_{IN}$. "I(V(n))" represents the current discharged from capacitor 806 and is modeled by a varying current source 810. "m" is the slope of the V(n)/I(V(n)) relationship line 808, and "b" is the y-intercept of the V(n)/I(V(n)) relationship line 808. The values of "m" and "b" are a matter of design choice and are, in at least one embodiment, chosen to best approximate an actual relationship between the input supply voltage $V_{IN}$ and the input current $i_{IN}$ (FIG. 3) for the modeled capacitor 806.

The change in voltage V(n) with respect to time is represented by Equation [2]:

$$dV(n)/dt=I(V)/C \qquad [2].$$

"dV(n)/dt" represents the change in voltage with respect to time, and "C" represents a capacitance of capacitor 806. In at least one embodiment, for ease of calculation, C=1. "dt" represents a change in time, and, in at least one embodiment, is a constant time period at which the zero crossing indicator value ZC is updated. The particular value of dt is a matter of design choice. In at least one embodiment, the value of dt is chosen based on a desired accuracy of the zero crossing indicator value ZC. In at least one embodiment, the zero crossing value ZC is updated at a frequency $f_{CALC}$, and $f_{CALC}$ is at least 10 kHz. Thus, dt, which equals $1/f_{CALC}$, is less than or equal to 0.0001 secs.

Equation [2] can be rearranged as Equation [3]:

$$dV(n)=(I(V)/C) \cdot dt \qquad [3].$$

Each subsequent value V(n+1) is related to the immediately preceding voltage value V(n) by Equation [4]:

$$V(n+1)=V(n)-dV(n) \qquad [4].$$

The initial value V(0) is provided by an actual sensed value of rectified input voltage $V_{\Phi R\_IN}$ at time $t_{SENSE}$. The voltage-current graph 804 provides a value of I(V) for each sample or calculation of V(n), and the value of each dV(n) for each increment of dt can, thus, be determined from Equation [3] and the value of I(V) from the voltage-current graph 804. Since the relationship between V(n) and I(V) is linear in voltage-current graph 804, the combination of Equations [1]-

[4] result in a parabolic function, and the values of V(n+1) will decrease in accordance with the parabolic function of Equation [4]. The input supply voltage $V_{IN}$ is, in at least one embodiment, a sine wave. The parabolic function of Equation [4] is relatively fast and easy to calculate and closely models a sine wave.

Comparator 812 compares the voltage value V(n) with a reference value $V_{ZC\_REF}$, and the zero crossing value ZC represents the result of the comparison. The reference value $V_{ZC\_REF}$ is chosen so that when the voltage value V(n) is less than the reference value $V_{ZC\_REF}$, the zero crossing value ZC changes state from a logical 0 to a logical 1 to indicate a zero crossing of the input supply voltage $V_{IN}$. In at least one embodiment, when the zero crossing of the input supply voltage $V_{IN}$ has been reached, the controller 304 (FIG. 3) transitions to hold or "glue" the rectified input voltage $V_{\Phi R\_IN}$ at a low value to prevent the phase cut dimmer 306 from prematurely firing during the next cycle of the input supply voltage $V_{IN}$ as, for example, described in Melanson I.

Equation [5] represents an approximation equation that can be used to iteratively determine an approximate zero crossing of the AC input supply voltage $V_{IN}$:

$$V_{APPROX}(i)=V_{APPROX}(i-1)-[k_1-V_{APPROX}[i-1])\cdot k_2 \quad [5].$$

"$V_{APPROX}(i)$" is the $i^{th}$ approximate zero crossing of the AC input supply voltage $V_{IN}$, "i" is an integer index, "$V_{APPROX}(i-1)$" is the approximate zero crossing value that immediately precedes the value of $V_{APPROX}(i)$. "$k_1$" and "$k_2$" are scaling factors. $k_1$ relates to the peak value of the input supply voltage and $k_2$ relates to the frequency and, thus, the step-size of each iteration of Equation [5].

For a 120 Vrms, 60 Hz input supply voltage, $k_1$=220, $k_2$=0.38, and starting at a 112 degree phase cut, the values of $V_{APPROX}(i)$ rounded to the nearest volt for Equation [5] are:
{157, 155, 152, 150, 147, 145, 142, 139, 136, 132, 129, 126, 122, 118, 114, 110, 106, 102, 97, 93, 88, 83, 78, 72, 67, 61, 55, 49, 42, 35, 28, 21, 13, 5, 0}

The actual sine wave values are:
{157, 155, 153, 150, 147, 144, 141, 137, 134, 130, 126, 122, 118, 114, 109, 104, 100, 95, 90, 85, 80, 74, 69, 64, 58, 52, 47, 41, 35, 29, 24, 18, 12, 6, 0}

For a 120 Vrms, 60 Hz input supply voltage, $k_1$=220, $k_2$=0.38, and starting at a 130 degree phase cut, the values of $V_{APPROX}(i)$ rounded to the nearest volt for Equation [5] are:
{130, 127, 123, 119, 116, 112, 107, 103, 99, 94, 89, 84, 79, 74, 68, 63, 57, 50, 44, 37, 30, 23, 16, 8, 0, −9}

The actual sine wave values are:
{130, 126, 122, 118, 114, 109, 104, 100, 95, 90, 85, 80, 74, 69, 64, 58, 52, 47, 41, 35, 29, 24, 18, 12, 6, 0}

Thus, there is a slight error between the actual zero crossing as indicated by the sine wave data and the determined approximate zero crossing determined using Equation [5]. However, the approximation of the zero crossing is sufficient to allow the controller 506 to accurately control the power converter 308 and maintain compatibility with the phase-cut dimmer 306. More accurate functions can be used if higher accuracy is desired.

Figure 9:
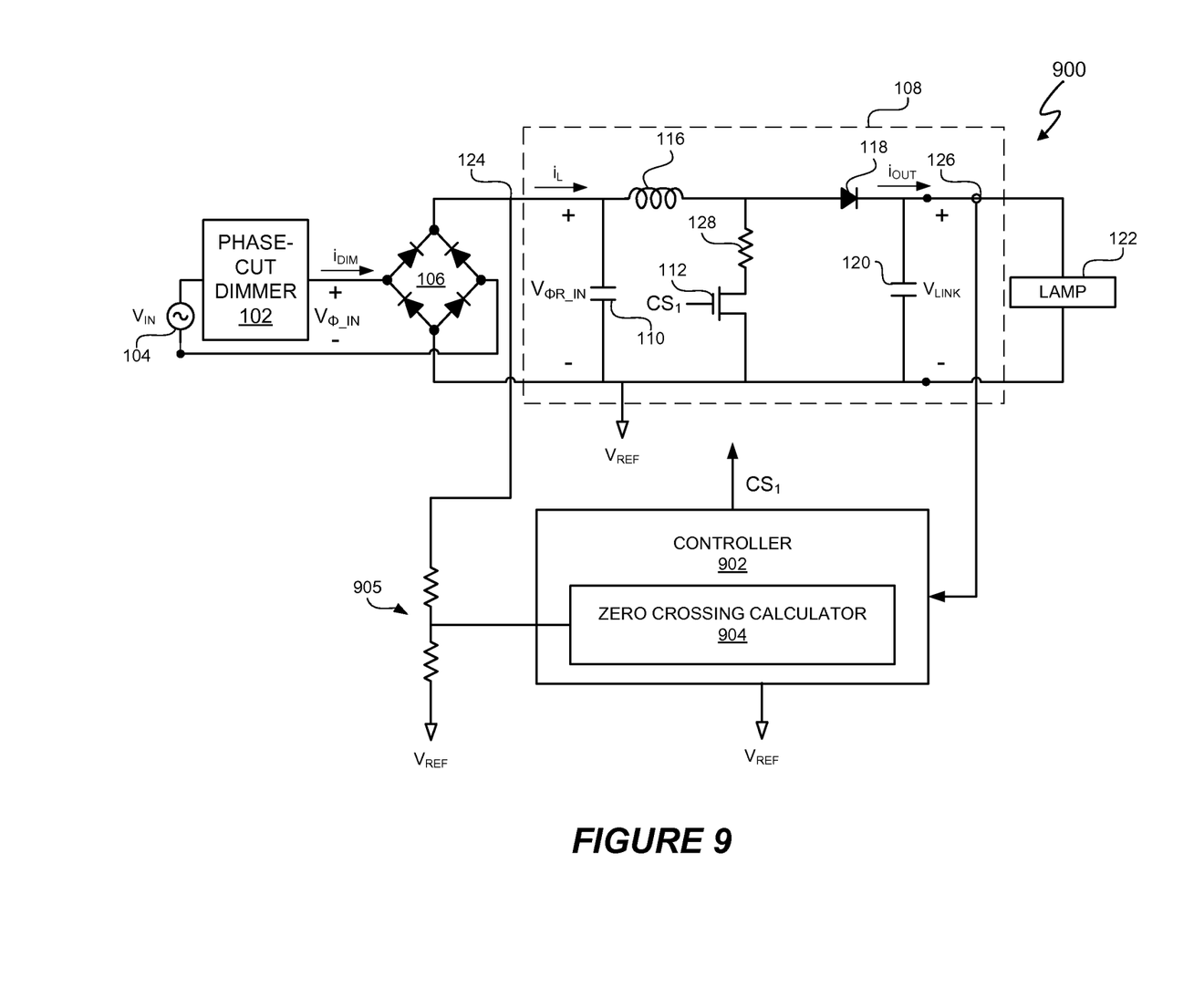
FIG. 9 depicts an electronic system that represents an embodiment of the electronic system of FIG. 3.

FIG. 9 depicts an electronic system 900, which represents one embodiment of the electronic system 300. Controller 902 senses the rectified input voltage $V_{\Phi R\_IN}$ at node 124. Controller 902 can sense the rectified input voltage $V_{\Phi R\_IN}$ in any desired manner, such as through a resistor divider circuit 905. Zero crossing calculator 904, which represents one embodiment of the zero crossing calculator 302 (FIG. 3), synthesizes the rectified input voltage $V_{\Phi R\_IN}$ as, for example, previously described in conjunction with zero crossing calculator 302, 500 (FIG. 5), or 700 (FIG. 7). In at least one embodiment, controller 902 controls the switching power converter as, for example, Melanson II, Melanson III, Melanson IV, or Melanson V.

Thus, a controller senses a leading edge, phase cut alternating current (AC) input voltage to a switching power converter at least at a time $t_0$ during a cycle of the AC input voltage. The time $t_0$ is prior to a zero crossing of the AC input voltage and at least some zero crossings of the AC input voltage are not directly observable by the controller. The controller is configured to determine an approximate zero crossing of the AC input voltage based on a voltage value of the AC input voltage at time $t_0$.

Although embodiments have been described in detail, it should be understood that various changes, substitutions, and alterations can be made hereto without departing from the spirit and scope of the invention as defined by the appended claims.

What is claimed is:

1. An apparatus comprising:
   a controller having an input to sense a leading edge, phase cut alternating current (AC) input voltage to a switching power converter at least at a first time during a cycle of the AC input voltage, wherein the cycle of the AC input voltage is derived from a cycle of an AC input supply voltage, the first time is prior to an approximate zero crossing of the cycle of the AC input supply voltage, and at least some approximate zero crossings of the AC input voltage are not directly observable by the controller, and the controller is configured to:
   determine the approximate zero crossing of the AC input supply voltage based on a voltage value of the phase cut AC input voltage sensed at the first time.

2. The apparatus of claim 1 wherein to determine the approximate zero crossing of the AC input supply voltage, the controller is configured to:
   approximate the AC input supply voltage using a function that estimates a waveform of the AC input supply voltage and determine the approximate zero crossing of the AC input supply voltage from the approximation of the AC input supply voltage.

3. The apparatus of claim 2 wherein to approximate the AC input supply voltage using a function that estimates a waveform of the AC input supply voltage, the controller is configured to approximate the AC input supply voltage using a polynomial function.

4. The apparatus of claim 2 wherein to approximate the AC input supply voltage using a function that estimates a waveform of the AC input supply voltage, the controller is configured to approximate the AC input supply voltage using a function whose output generally decreases over time.

5. The apparatus of claim 1 wherein to determine the approximate zero crossing of the AC input supply voltage, the controller is configured to:
   synthesize the AC input supply voltage to determine a delay to the approximate zero crossing from the first time.

6. The apparatus of claim 1 wherein the first time occurs at an end of power transfer by the switching power converter to a load.

7. The apparatus of claim 1 wherein to determine the approximate zero crossing of the AC input supply voltage, the controller is configured to:
   observe the phase cut AC input voltage during a cycle of the phase cut AC input voltage for a first time period beginning at or before the leading edge of the AC input supply voltage until when the phase cut AC input voltage disconnects from the switching power converter; and utilize data associated with the observation of the phase cut AC input voltage from the first time period to determine the approximate zero crossing of the AC input supply voltage.

8. The apparatus of claim 7 wherein the first time period is a period of time during a cycle of the AC input supply voltage when a lamp draws sufficient current so that the phase cut AC voltage tracks the AC input voltage.

9. The apparatus of claim 7 wherein to determine the approximate zero crossing of the AC input supply voltage, the controller is configured to:
iteratively approximate the AC input supply voltage after the first time period until the iterative approximation indicates that the AC input supply voltage equals approximately zero.

10. The apparatus of claim 1 wherein the controller is further configured to:
sense the phase cut AC input voltage at an input voltage node of the controller at the first time while current is drawn through the switching power converter by a load.

11. The apparatus of claim 10 wherein the load comprises a lamp, and the lamp comprises one or more light emitting diodes.

12. The apparatus of claim 1 wherein the controller is further configured to:
hold the phase cut AC input voltage at a constant value until the controller determines the approximate zero crossing of the AC input supply voltage; and
release the phase cut AC input voltage at a time of the approximate zero crossing of the AC input supply voltage as determined by the controller.

13. The apparatus of claim 12 wherein to release the phase cut AC input voltage at a time of the approximate zero crossing of the AC input supply voltage as determined by the controller comprises to release the phase cut AC input voltage when the controller determines the approximate zero crossing of the AC input supply voltage.

14. The apparatus of claim 1 wherein the voltage value of the phase cut AC input voltage sensed at the first time is selected from a group consisting of: greater than or equal to 50V or greater than or equal to 0.3 times a root mean square value of a peak value of the phase cut AC input voltage.

15. The apparatus of claim 1 wherein the controller is further configured to:
determine the approximate zero crossing of the AC input supply voltage based on the voltage value of the phase cut AC input voltage sensed at the first time when the approximate zero crossings of the AC input voltage and approximate zero crossings of the AC input supply voltage are not observable by the controller.

16. The apparatus of claim 1 wherein the controller is further configured to determine the first time for cycles of the AC input voltage based on at least when the switching power converter has received sufficient power from a voltage supply to maintain an approximately constant link voltage and meet power demands of a load coupled to the switching power converter.

17. A method comprising:
receiving a sense signal indicating a leading edge, phase cut alternating current (AC) input voltage to a switching power converter, wherein the sense signal is received at least at a first time during a cycle of the AC input voltage, the cycle of the AC input voltage is derived from a cycle of an AC input supply voltage, the first time is prior to an approximate zero crossing of the cycle of the AC input supply voltage, and at least some approximate zero crossings of the AC input voltage are not directly observable by a controller of a switching power converter; and
determining the approximate zero crossing of the AC input supply voltage based on a voltage value of the phase cut AC input voltage sensed at the first time.

18. The method of claim 17 wherein determining the approximate zero crossing of the AC input supply voltage further comprises:
estimating a waveform of the AC input supply voltage; and
determining the approximate zero crossing of the AC input supply voltage from the approximation of the AC input supply voltage.

19. The method of claim 18 wherein estimating a waveform of the AC input supply voltage further comprises:
approximating the AC input supply voltage using a function that estimates a waveform of the AC input supply voltage.

20. The method of claim 19 wherein approximating the AC input supply voltage using a function that estimates a waveform of the AC input supply voltage further comprises:
approximating the AC input supply voltage using a polynomial function.

21. The method of claim 19 wherein approximating the AC input supply voltage using a function that estimates a waveform of the AC input supply voltage further comprises:
approximating the AC input supply voltage using a function whose output generally decreases over time.

22. The method of claim 17 wherein determining the approximate zero crossing of the AC input supply voltage further comprises:
synthesizing the AC input supply voltage to determine a delay to the approximate zero crossing from the first time.

23. The method of claim 17 wherein the first time occurs at an end of power transfer by the switching power converter to a load.

24. The method of claim 17 wherein determining the approximate zero crossing of the AC input supply voltage further comprises:
observing the phase cut AC input voltage during a cycle of the phase cut AC input voltage for a first time period beginning at or before the leading edge of the AC input supply voltage until when the phase cut AC input voltage disconnects from a switching power converter; and
utilizing data associated with the observation of the phase cut AC input voltage from the first time period to determine the approximate zero crossing of the AC input supply voltage.

25. The method of claim 24 wherein the first time period is a period of time during a cycle of the AC input supply voltage when a lamp draws sufficient current so that the phase cut AC voltage tracks the AC input voltage.

26. The method of claim 24 wherein determining the approximate zero crossing of the AC input supply voltage further comprises:
iteratively approximating the AC input supply voltage after the first time period until the iterative approximation indicates that the AC input supply voltage equals approximately zero.

27. The method of claim 17 further comprising:
exposing the phase cut AC input voltage to an input voltage node of the controller at the first time while current is drawn through the switching power converter by a load.

28. The method of claim 27 wherein the load comprises a lamp, and the lamp comprises one or more light emitting diodes.

29. The method of claim 17 wherein the controller is further configured to:
- hold the phase cut AC input voltage at a constant value until the controller determines the approximate zero crossing of the AC input supply voltage; and
- release the phase cut AC input voltage at a time of the approximate zero crossing of the AC input supply voltage as determined by the controller.

30. The method of claim 29 wherein releasing the phase cut AC input voltage at a time of the determined approximate zero crossing of the AC input supply voltage further comprises:
- releasing the phase cut AC input voltage when the controller determines the approximate zero crossing of the AC input supply voltage.

31. The method of claim 17 wherein the voltage value of the phase cut AC input voltage sensed at the first time is selected from a group consisting of: greater than or equal to 50V or greater than or equal to 0.3 times a root mean square value of a peak value of the phase cut AC input voltage.

32. The method of claim 17 wherein determining the approximate zero crossing of the AC input supply voltage based on a voltage value of the phase cut AC input voltage sensed at the first time further comprises:
- determining the approximate zero crossing of the AC input supply voltage based on the voltage value of the phase cut AC input voltage sensed at the first time when the approximate zero crossings of the AC input voltage and approximate zero crossings of the AC input supply voltage are not observable by the controller.

33. The method of claim 17 further comprising:
- determining the first time for cycles of the AC input voltage based on at least when the switching power converter has received sufficient power from a voltage supply to maintain an approximately constant link voltage and meet power demands of a load coupled to the switching power converter.

34. A method comprising:
- exposing a leading edge, phase cut alternating current (AC) input voltage supplied to a switching power converter for part of a cycle of the AC input voltage, wherein the exposed AC input voltage is used to supply current to a load and the AC input voltage is derived from an AC input supply voltage;
- sensing the AC input voltage;
- ceasing exposure of the AC input voltage after sensing the AC input voltage and prior to an occurrence of an approximate zero crossing of the AC input voltage; and
- determining an approximate zero crossing of the AC input supply voltage based on a value of the sensed AC input voltage.

35. The method of claim 34 wherein determining an approximate zero crossing of the AC input supply voltage based on a value of the sensed AC input voltage further comprises:
- determining the approximate zero crossing of the AC input supply voltage based on the voltage value of the phase cut AC input voltage sensed at the first time when the approximate zero crossings of the AC input voltage and approximate zero crossings of the AC input supply voltage are not observable by the controller.

36. The method of claim 34 further comprising:
- determining at least when the switching power converter has received sufficient power from a voltage supply to maintain an approximately constant link voltage and meet power demands of a load coupled to the switching power converter;
- wherein ceasing exposure of the AC input voltage after sensing the AC input voltage and prior to an occurrence of an approximate zero crossing of the AC input voltage further comprises ceasing exposure of the AC input voltage when the switching power converter has received sufficient power from a voltage supply to maintain an approximately constant link voltage and meet power demands of a load coupled to the switching power converter.

37. An apparatus comprising:
- means for receiving a sense signal indicating a leading edge, phase cut alternating current (AC) input voltage to a switching power converter, wherein the sense signal is received at least at a first time during a cycle of the AC input voltage, the cycle of the AC input voltage is derived from a cycle of an AC input supply voltage, the first time is prior to an approximate zero crossing of the cycle of the AC input supply voltage, and at least some zero crossings of the AC input supply voltage are not directly observable by a controller of a switching power converter; and
- means for determining the approximate zero crossing of the AC input supply voltage based on a voltage value of the phase cut AC input voltage sensed at the first time.

38. The apparatus of claim 37 wherein the means for determining the approximate zero crossing of the AC input supply voltage based on a voltage value of the phase cut AC input voltage sensed at the first time further comprises a means for determining the approximate zero crossing of the AC input supply voltage based on the voltage value of the phase cut AC input voltage sensed at the first time when the approximate zero crossings of the AC input voltage and approximate zero crossings of the AC input supply voltage are not observable by the controller.

39. The apparatus of claim 37 wherein the apparatus further comprises means for determining the first time for cycles of the AC input voltage based on at least when the switching power converter has received sufficient power from a voltage supply to maintain an approximately constant link voltage and meet power demands of a load coupled to the switching power converter.

* * * * *